(12) United States Patent
Tanaka et al.

(10) Patent No.: US 9,784,764 B2
(45) Date of Patent: Oct. 10, 2017

(54) PROBE AND METHOD OF MANUFACTURING PROBE

(71) Applicant: FUJITSU COMPONENT LIMITED, Tokyo (JP)

(72) Inventors: Tetsugaku Tanaka, Tokyo (JP); Koki Sato, Tokyo (JP); Mitsuru Kobayashi, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 37 days.

(21) Appl. No.: 14/452,592

(22) Filed: Aug. 6, 2014

(65) Prior Publication Data
US 2015/0048859 A1 Feb. 19, 2015

(30) Foreign Application Priority Data

Aug. 19, 2013 (JP) .................. 2013-169973

(51) Int. Cl.
| | | |
|---|---|---|
| H01R 13/24 | (2006.01) | |
| G01R 3/00 | (2006.01) | |
| G01R 1/067 | (2006.01) | |

(52) U.S. Cl.
CPC ........... G01R 3/00 (2013.01); G01R 1/06722 (2013.01); *Y10T 29/49204* (2015.01)

(58) Field of Classification Search
CPC .. G01R 3/00; G01R 1/06716; G01R 1/06733; G01R 1/06722; G01R 1/06738; G01R 1/07328; G01R 1/07357; G01R 1/067; H01R 13/2428; H01R 2201/20; H01R 43/16; H01R 43/04; H01R 43/26; Y10T 29/49204; Y10T 29/49208; Y10T 29/49218; B21D 13/02; B21D 13/04; B21D 13/00; B21D 33/00; B21D 53/04; B21D 13/08; B21D 13/10; B21D 22/02; B21D 13/045; B21D 19/08; B21D 11/20; B21D 28/04; B21D 28/26
See application file for complete search history.

(56) References Cited

U.S. PATENT DOCUMENTS

| | | | | |
|---|---|---|---|---|
| 5,377,682 A  * | 1/1995 | Ueno | ....................... | A61B 8/12 600/446 |
| 7,148,713 B1 * | 12/2006 | Meek | .................. | G01R 1/06716 324/754.14 |
| 8,471,578 B2 * | 6/2013 | Sato | .................... | G01R 1/06722 324/754.01 |
| 8,587,333 B2 * | 11/2013 | Sato | .................... | G01R 1/06716 324/500 |

(Continued)

FOREIGN PATENT DOCUMENTS

| | | |
|---|---|---|
| JP | H09-121007 | 5/1997 |
| JP | 2007-024664 | 2/2007 |

(Continued)

*Primary Examiner* — Alesa Allgood
(74) *Attorney, Agent, or Firm* — IPUSA, PLLC

(57) ABSTRACT

A probe for connecting an electrode terminal of an electric circuit or an electric component includes a first spring; a second spring covering the first spring; a cover covering the second spring; a first terminal that is connected to the second spring and is provided at one end of the probe; and a second terminal that is connected to the cover and is provided at another end of the probe.

7 Claims, 12 Drawing Sheets

(56) References Cited

U.S. PATENT DOCUMENTS

2011/0252657 A1* 10/2011 Sato .................. G01R 1/06716
                                                                   33/561
2014/0320158 A1* 10/2014 Hsiao ................ G01R 1/06722
                                                              324/755.01

FOREIGN PATENT DOCUMENTS

| JP | 2007-071699 | 3/2007 |
| JP | 2011-227035 | 11/2011 |
| JP | 2013-120065 | 6/2013 |

* cited by examiner

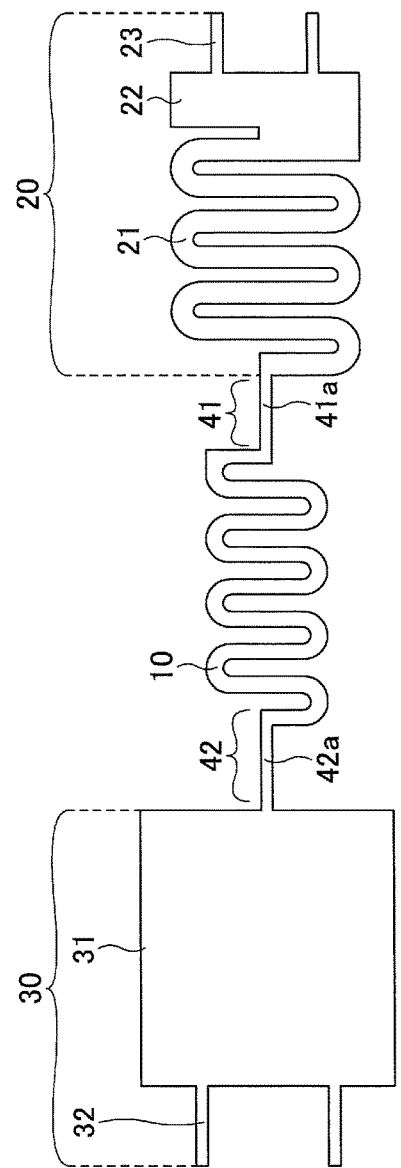

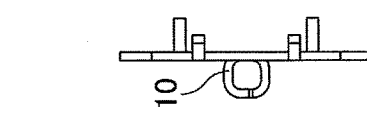
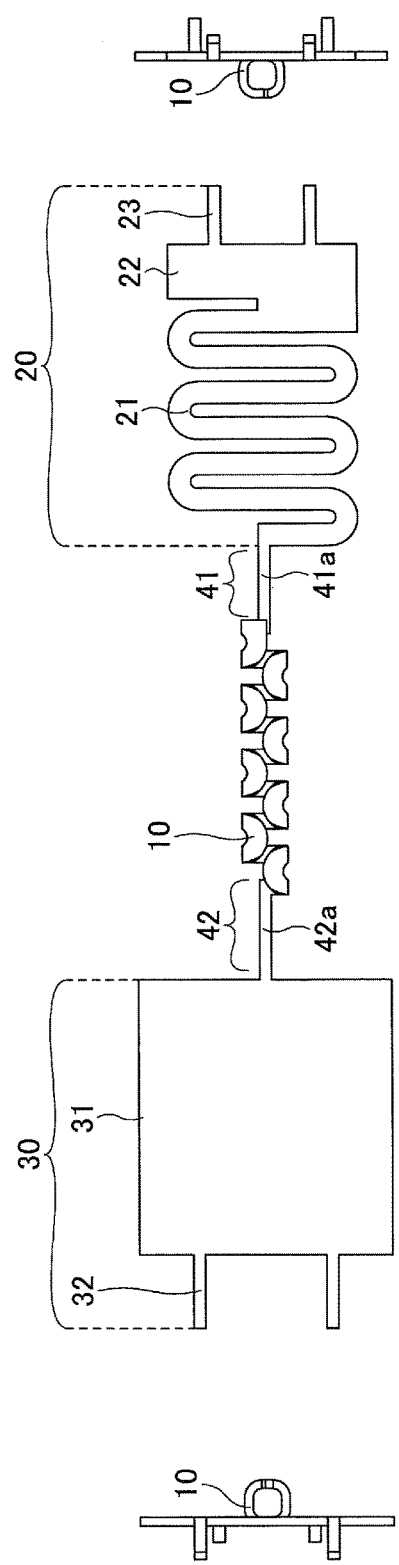
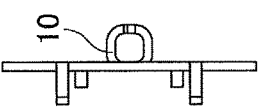
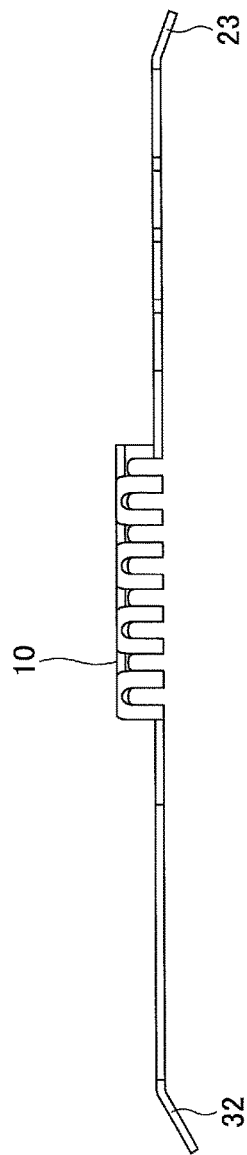

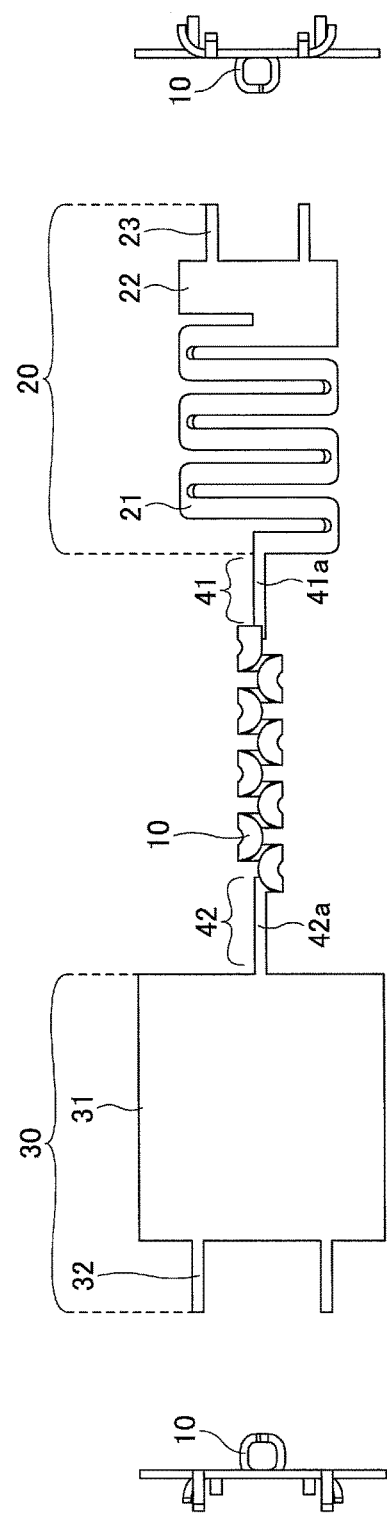

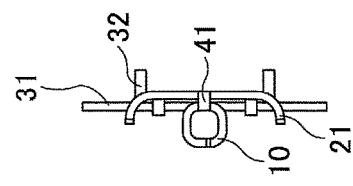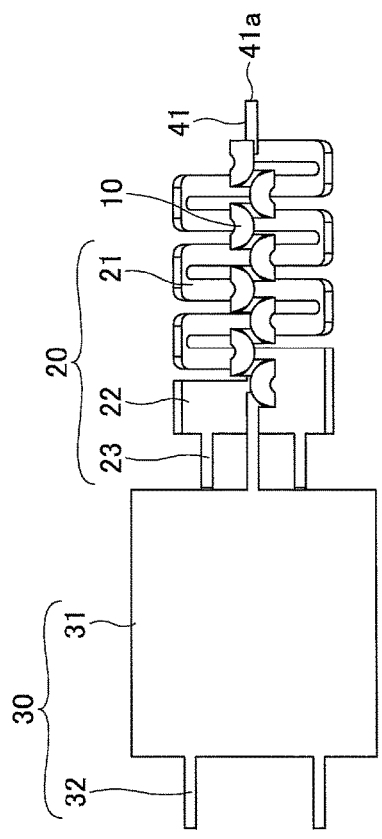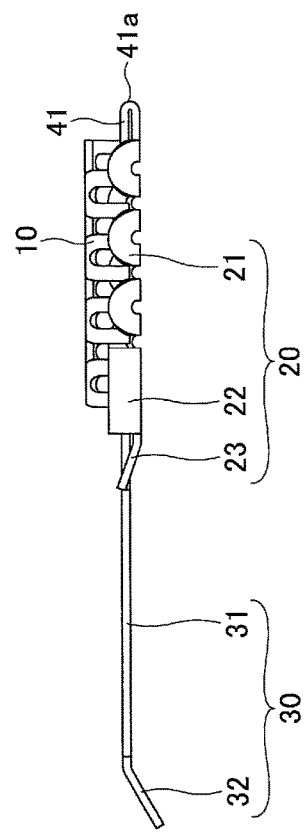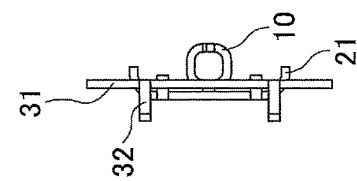

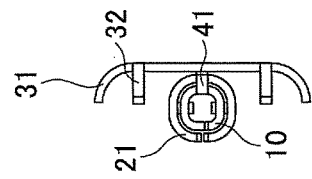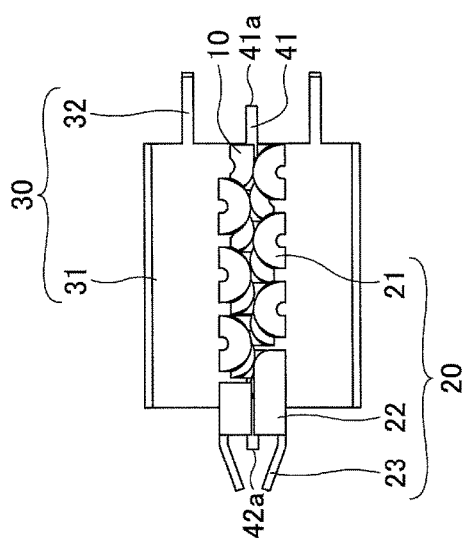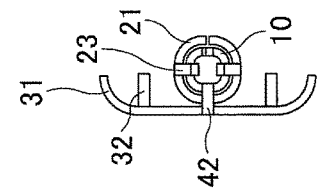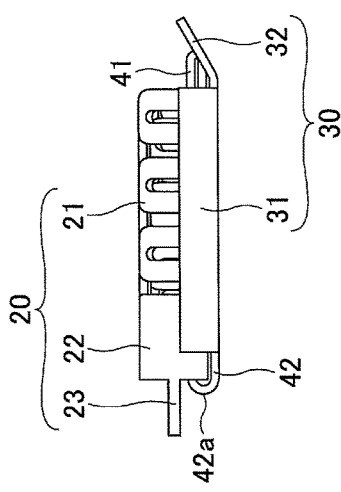

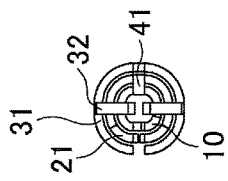
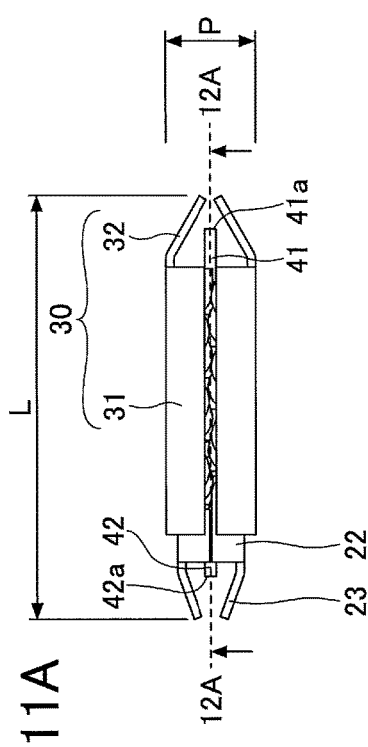
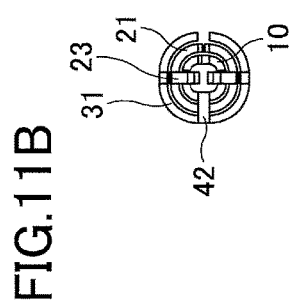
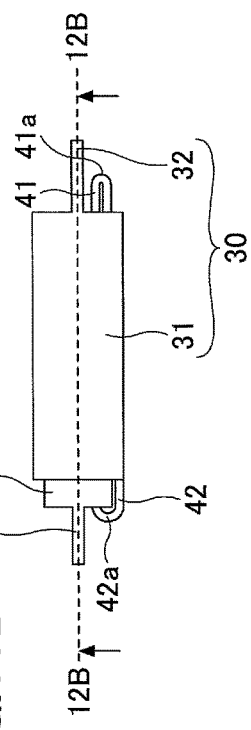
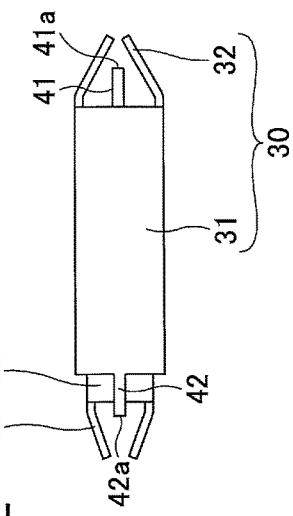

PROBE AND METHOD OF MANUFACTURING PROBE

CROSS-REFERENCE TO RELATED APPLICATIONS

This patent application is based upon and claims the benefit of priority of Japanese Patent Application No. 2013-169973 filed on Aug. 19, 2013, the entire contents of which are incorporated herein by reference.

BACKGROUND OF THE INVENTION

1. Field of the Invention

The present invention relates to a probe and a method of manufacturing the probe.

2. Description of the Related Art

When a semiconductor integrated circuit or the like is manufactured, a measuring instrument for measuring electric characteristics of the semiconductor integrated circuit formed on the wafer is used. Such a measuring instrument performs electric measurement by causing an electrode pad or an electrode terminal formed on a wafer to directly contact a probe for electrically connecting the electrode pad or the electrode terminal so that the probe is electrically connected to the electrode pad or the electrode terminal.

As such a probe, a so-called coil spring probe is ordinarily used. The coil spring probe includes a built-in coil spring inside a barrel in a cylindrical shape. One end of the coil spring is a contact terminal of the probe and contacts the electrode pad or the electrode terminal formed on the wafer or the like. The other end of the coil spring is electrically connected to measurement hardware. In the coil spring probe, because a coil spring is provided inside the barrel, the contact terminal of the probe can extend or contract to enable an ensured electric contact between the probe and the electrode pad or the electrode terminal.

[Patent Document 1] Japanese Laid-open Patent Publication No. 2007-24664
[Patent Document 2] Japanese Laid-open Patent Publication No. 2007-71699
[Patent Document 3] Japanese Laid-open Patent Publication No. 2011-227035

SUMMARY OF THE INVENTION

According to an aspect of an embodiment of the present invention, there is provided a probe for connecting an electrode terminal of an electric circuit or an electric component including a first spring; a second spring covering the first spring; a cover covering the second spring; a first terminal that is connected to the second spring and is provided at one end of the probe; and a second terminal that is connected to the cover and is provided at another end of the probe According to another aspect of an embodiment of the present invention, there is provided a method of manufacturing a probe to be connected to an electrode terminal of an electric circuit or an electric component including a metallic plate forming process of forming a metallic plate to be a predetermined shape; and a folding process of folding the metallic plate, wherein the predetermined shape has a first contact terminal portion, a second spring portion, a first connecting portion, a first spring portion, a second connecting portion, a chassis portion, and a second contact terminal portion in this order from one end of the probe to another end of the probe, wherein, in the folding process, the first connecting portion and the second connecting portion are folded.

According to another aspect of an embodiment of the present invention, there is provided a probe electrically connecting an electrode provided in an object to another electrode provided in another object including a first spring portion; a second spring portion covering the first spring portion, one end of the first spring portion continuing from one end of the second spring portion; a chassis portion covering the second spring portion, the chassis portion continuing from another end of the first spring portion; a first contact terminal portion contacting the electrode and continuing from another end of the second spring portion; and a second contact terminal portion contacting the another electrode and continuing from the chassis portion.

BRIEF DESCRIPTION OF THE DRAWINGS

FIGS. 2A-2D are a set of process charts of the method of manufacturing the probe of the embodiment;

FIGS. 3A-3D are another set of process charts of the method of manufacturing the probe of the embodiment;

FIGS. 4A-4D are another set of process charts of the method of manufacturing the probe of the embodiment;

FIGS. 5A-5D are another set of process charts of the method of manufacturing the probe of the embodiment;

FIGS. 8A-8D are another set of process charts of the method of manufacturing the probe of the embodiment;

FIGS. 11A-11E are a set of structural drawings of the outer appearance of the probe of the embodiment.

DESCRIPTION OF EMBODIMENTS

A description of embodiments of the present invention is given below, with reference to the FIG. 1 through FIG. 12B.

The embodiments described below are only examples and the present invention is not limited to the embodiments.

Through all figures illustrating the embodiments, the same references symbols are used for portions having the same function, and repetitive explanations of these portions are omitted.

Method of Manufacturing Probe

Referring to FIGS. 1 to 8D, the method of manufacturing the probe of the embodiment is described. The probe is manufactured by bending a metallic plate which is provided by a punching process or the like.

Figure 1:
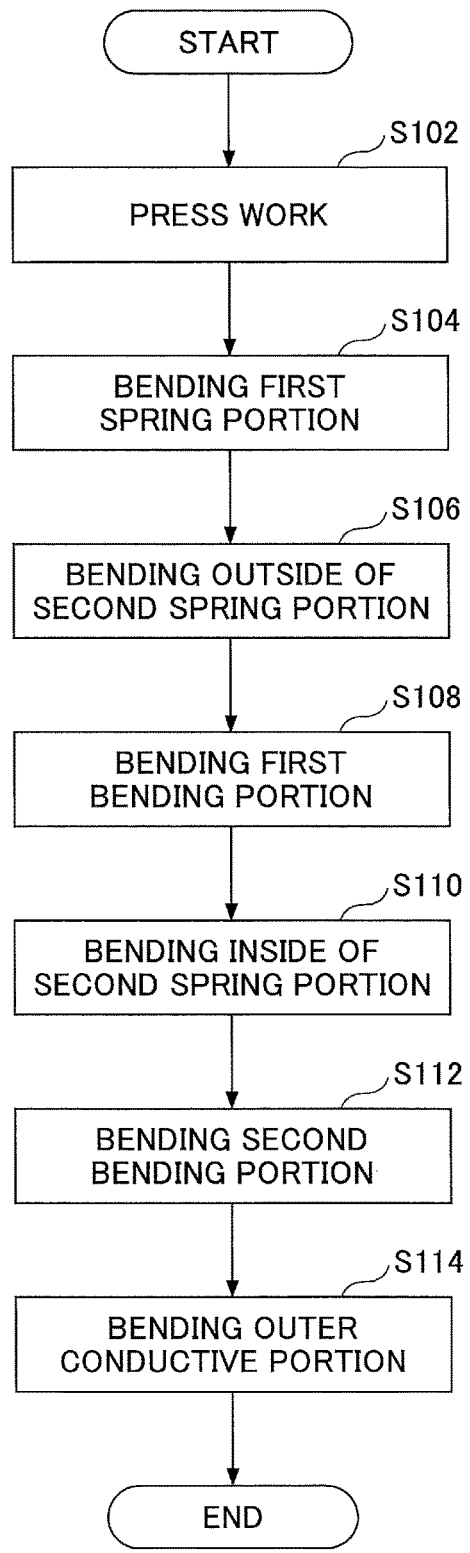
FIG. 1 is a flowchart of the method of manufacturing a probe of an embodiment.

FIG. 1 is a flowchart illustrating the method of manufacturing the probe of the embodiment. At first, referring to step S102, a metallic plate is formed to have a predetermined shape to manufacture the probe of the embodiment (a metallic plate forming process). In order to form the metallic plate in S102, the metallic plate is punched by press work, or by forming a mask having a predetermined shape a metallic plate and an area without the mask is etched. The metallic plate is formed by an alloy including copper or an alloy such as phosphor bronze containing copper, and has a thickness of 30 μm to 150 μm. Within the embodiment, a copper plate having a thickness of 50 μm is used to form a metallic plate having a predetermined shape by the press work.

FIGS. 2A-2D illustrate the metallic plate formed to have the predetermined shape. FIG. 2A is a plan view of the metallic plate in the metallic plate forming process of S102, FIG. 2B is a front view, FIG. 2C is a back view, and FIG. 2D is a side view. The metallic plate illustrated in FIGS. 2A-2D is formed by processing a sheet of the metallic plate as described above. Specifically, the processed metallic plate includes a first spring portion 10 positioned in a middle of the metallic plate, an intermediate conductive spring portion 20 connected to one side of the first spring portion 10, and an outer conductive portion 30 connected to the other side of the first spring portion 10.

The first spring portion 10 is formed by punching the metallic plate in a meander shape in order to form a spring. The intermediate conductive spring portion 20 includes a second spring portion 21, a plunger portion 22, and a first contact terminal portion 23 that is one of contact terminal portions. The plunger portion 22 is formed between the second spring portion 21 and the first contact terminal portion 23. The second spring portion 21 is formed by punching the metallic plate in a meander shape in order to form a spring. The outer conductive portion 30 includes a chassis portion 31 entirely covering the probe and a second contact terminal portion 32 being the other one of the contact terminal portions.

The first spring portion 10 is connected to the intermediate conductive spring portion 20 through a first connecting portion 41. The first connecting portion 41 is bent at a first bent portion 41a as described later. The first spring portion 10 is connected to the outer conductive portion 30 through a second connecting portion 42. The second connecting portion 42 is bent at a second bent portion 42a as described later.

Within the embodiment, the metallic plate illustrated in FIG. 2A includes the first contact terminal portion 23, the plunger portion 22, the second spring portion 21, the first connecting portion 41, the first spring portion 10, the second connecting portion 42, the chassis portion 31, and the second contact terminal portion 32 in this order from one end to the other end.

Next, in step S104, as illustrated in FIGS. 3A-3D, side edges of the first spring portion 10 on both outer sides are inward bent by about 90° (in the upper direction on FIG. 3D), and a half of every bent side edge is further inward bent by about 90°. By bending in this manner, the cross-sectional shape of the first spring portion 10 becomes substantially a square. As described, a first spring to be positioned at the innermost part of the probe of the embodiment is formed from the first spring portion 10. In this process of step S104, an end part of the first contact terminal portion 23 of the intermediate conductive spring portion 20 and an end part of the second contact terminal portion 32 of the outer conductive portion 30 may be bent so as to have a desirable terminal shape. FIG. 3A is a plan view of the metallic plate in this process of S104, FIG. 3B is a front view, FIG. 3C is a back view, and FIG. 3D is a side view.

Next, in step S106, as illustrated in FIGS. 4A-4D, side edge parts of the second spring portion 21 and side edge parts of the plunger portion 22 on both outer sides of the intermediate conductive spring portion 20 are inward bent by about 90° (in the lower direction on FIG. 4D). FIG. 4A is a plan view of the metallic plate in this process of S106, FIG. 4B is a front view, FIG. 4C is a back view, and FIG. 4D is a side view.

Next, in step S108, as illustrated in FIGS. 5A-5D, the intermediate conductive spring portion 20 is bent onto a side of the first spring portion 10 by about 180° at the first bent portion 41a of the first connecting portion 41. The intermediate conductive spring portion 20 is positioned on a side below the first spring portion 10 on FIG. 5D. In this process of S108, the intermediate conductive spring portion 20 is bent at the first bent portion 41a so as to cover the first spring portion 10 in a subsequent process. FIG. 5A is a plan view of the metallic plate in this process of S108, FIG. 5B is a front view, FIG. 5C is a back view, and FIG. 5D is a side view.

Figure 6C:
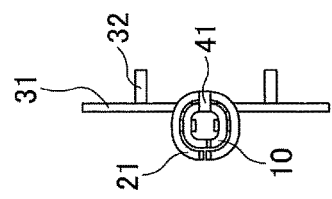
FIGS. 6A-6D are another set of process charts of the method of manufacturing the probe of the embodiment.
Figure 6A:
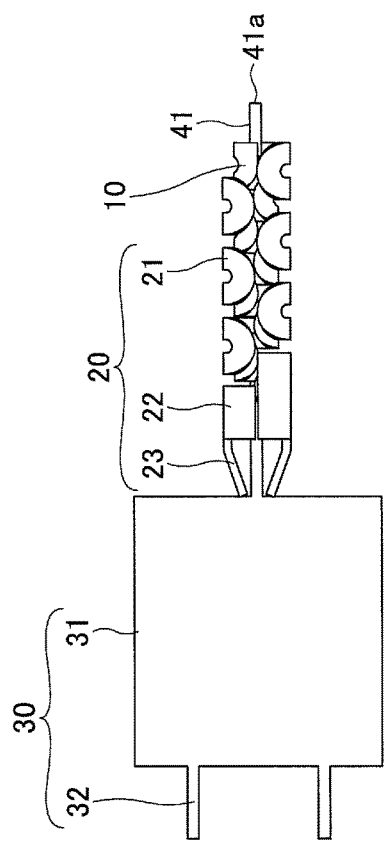
Figure 6D:
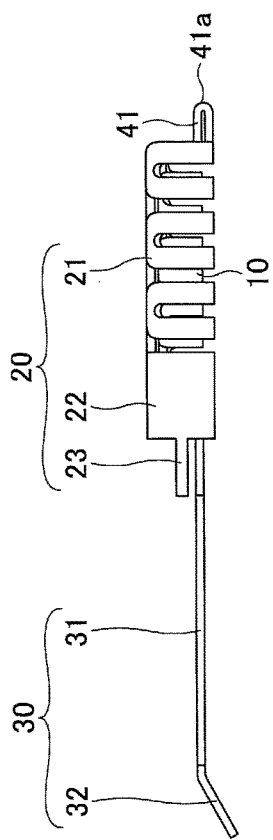
Figure 6B:
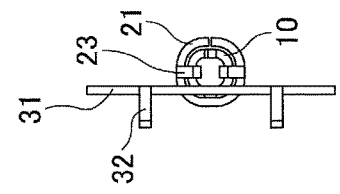

Next, in step S110, as illustrated in FIGS. 6A-6D, a half of every side edge part of the second spring portion 21 and a half of the plunger portion 22 on both sides of the intermediate conductive spring portion 20 are inward bent by about 90° (in the upper direction on FIG. 6D). As described above, in the probe of the embodiment, a second spring is formed from the second spring portion 21 to cover the first spring portion 10. FIG. 6A is a plan view of the metallic plate in this process of S110, FIG. 6B is a front view, FIG. 6C is a back view, and FIG. 6D is a side view.

Figure 7C:
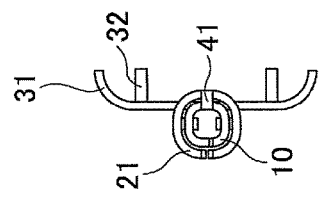
FIGS. 7A-7D are another set of process charts of the method of manufacturing the probe of the embodiment.
Figure 7A:
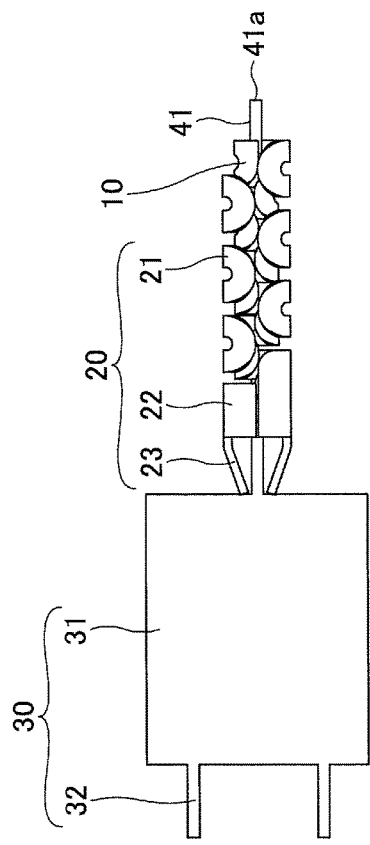
Figure 7D:
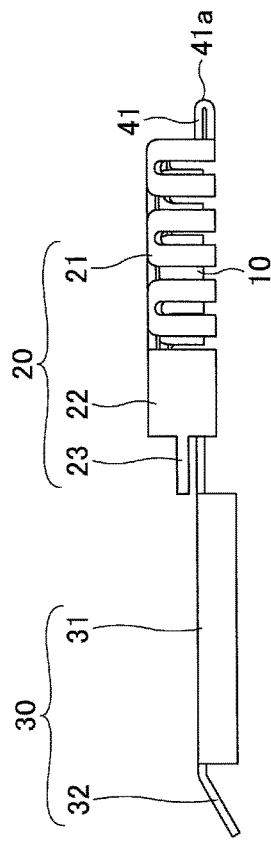
Figure 7B:
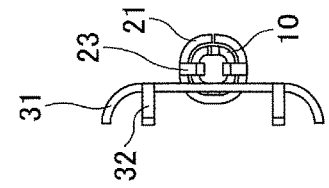

Thereafter, as illustrated in FIGS. 7A-7D, side edge parts on both outer sides of the outer conductive portion 30 are inward bent by about 90° (in the lower direction on FIG. 7D). FIG. 7A is a plan view of the metallic plate in this process of S110, FIG. 7B is a front view, FIG. 7C is a back view, and FIG. 7D is a side view.

Next, in step S112, as illustrated in FIGS. 8A-8D, the outer conductive portion 30 is bent onto a side of the first spring portion 10 and the intermediate conductive spring portion 20 by about 180° at the second bent portion 42a of the second connecting portion 42. The outer conductive portion 30 is positioned on a side below the intermediate conductive spring portion 20 on FIG. 8D. In this process of S112, the outer conductive portion 30 is bent at the second bent portion 42a so as to cover the second spring portion 21 in a subsequent process. FIG. 8A is a plan view of the metallic plate in this process of S112, FIG. 8B is a front view, FIG. 8C is a back view, and FIG. 8D is a side view.

Figure 9C:
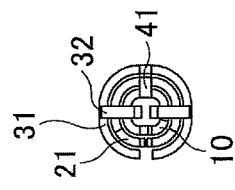
FIGS. 9A-9D are another set of process charts of the method of manufacturing the probe of the embodiment.
Figure 9A:
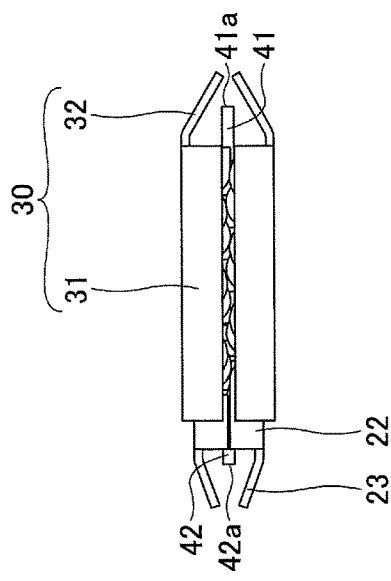
Figure 9B:
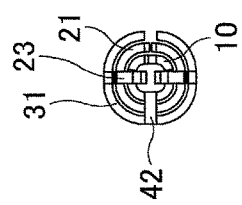
Figure 9D:
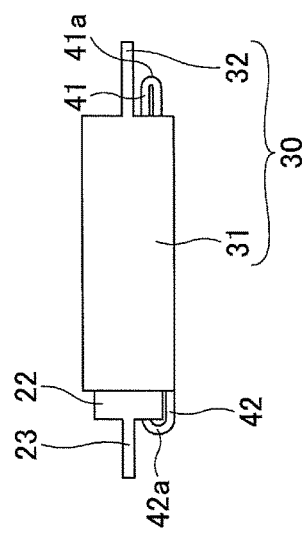

In step S114, as illustrated in FIGS. 9A-9D, the chassis portion 31 of the outer conductive portion 30 is inward bent by about 90° (in the upper direction on FIG. 9D) so as to cover the second spring portion 21 of the intermediate conductive spring portion 20. At this time, it is preferable to bend the chassis portion 31 of the outer conductive portion 30 so as to contact the plunger portion 22 of the intermediate conductive spring portion 20. FIG. 9A is a plan view of the metallic plate in this process of S114, FIG. 9B is a front view, FIG. 9C is a back view, and FIG. 9D is a side view.

The prove of the embodiment can be made by the above method. Within the embodiment, the probe can be manufactured by processing the sheet of the metallic plate. Therefore, it is unnecessary to assemble multiple components, and an assembling process can be omitted. Further, because the manufacturing process is simple, a great number of probes having a function of a spring can be manufactured at a low cost within a short time. Within the embodiment, a method of manufacturing the probe whose cross-sectional shape is substantially square is described. However, it is possible to manufacture a probe having a substantially circular cross-sectional shape by changing a mode of bending the metallic plate in the process of the embodiment.

Structure of Probe

Figure 10:
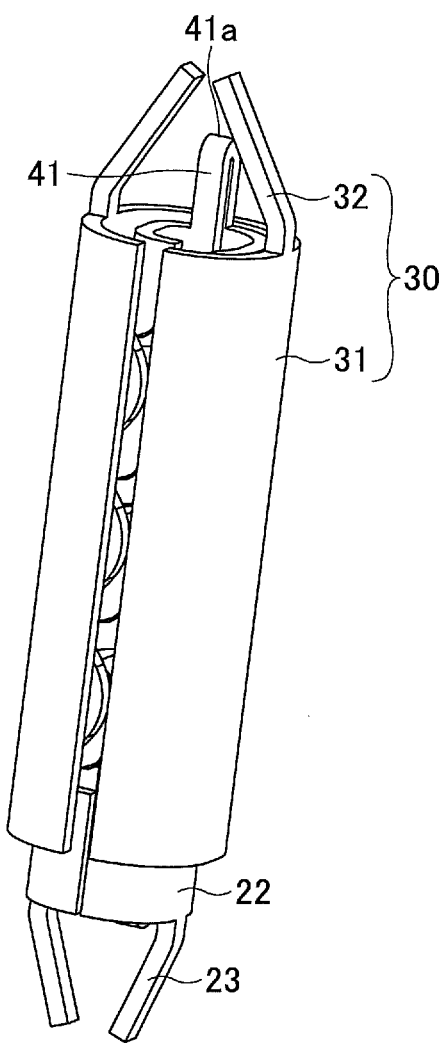
FIG. 10 is a perspective view of the outer appearance of the probe of the embodiment.
Figure 12A:
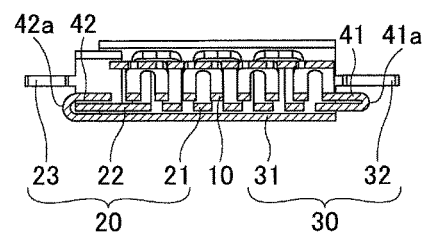
FIGS. 12A and 12B are cross-sectional views of the probe of the embodiment.
Figure 12B:
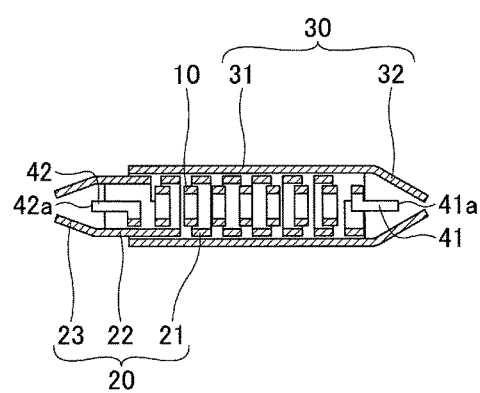

Next, referring to FIGS. 10 to 12B, the probe of the embodiment is described. The probe of the embodiment is used to perform a test of an electronic component, an electric circuit, or the like and electric measurement for the electronic component, the electric circuit, or the like. The probe is configured to electrically connect to the electrode pad, the electrode terminal, or the like formed on the electronic component, the electric circuit, or the like. FIG. 10 is a perspective view of the outer appearance of the probe of the embodiment. FIG. 11A is a plan view of the outer appearance of the probe of the embodiment, FIG. 11B is a front view, FIG. 11C is a back view, FIG. 11D is a side view, and FIG. 11E is a bottom view. FIG. 12A is a cross-sectional view taken along a broken line 12A-12A in FIG. 11A. FIG. 12B is a cross-sectional view taken along a broken line 12B-12B in FIG. 11B.

As described above, the probe of the embodiment is manufactured by bending a part obtained by punching a sheet of the metallic plate made of, for example, copper or an alloy made of copper. The probe of the embodiment is integrally formed where all portions of the probe are connected. Hereinafter, the electrode pad, the electrode terminal, or the like is referred to as an "electrode terminal".

The probe of the embodiment is covered by a cylindrical chassis portion 31, a second spring portion 21 is provided inside the chassis portion 31, and the first spring portion 10 is provided inside the second spring portion 21.

The first spring portion 10 is connected to the second spring portion 21 through the first connecting portion 41. The first connecting portion 41 is bent at the first bent portion 41a. The second spring portion 21 is a portion of the intermediate conductive spring portion 20 and is connected to the plunger portion 22 and the first contact portion 23, which are portions of the intermediate conductive spring portion 20.

The first spring portion 10 is connected to the chassis portion 31 through the second connecting portion 42. The second connecting portion 42 is bent at the second bent portion 42a. The chassis portion 31 is a portion of the outer conductive portion 30 and is connected to the second contact terminal portion 32, which is a portion of the outer conductive portion 30. In the probe of the embodiment, it is possible to electrically connect two corresponding electrode terminals through the prove that includes the first contact terminal portion 23 and the second contact terminal portion 32.

Within the embodiment, the probe is small enough to have a length L of about 2.6 mm and an outer diameter P of about 0.6 mm. Within the embodiment, the first spring portion 10 is formed on the innermost side, and the second spring portion 21 is formed on the outside of the first spring portion 10. Therefore, in comparison with a probe having only one spring inside itself, the amount of displacement can be substantially doubled. Therefore, even if the size is compact, stable and ensured contact is obtainable.

According to the embodiment, because the sheet of the metallic plate can be manufactured by processing the sheet of the metallic plate, an assembling process or the like is not necessary so that the probe can be manufactured at a low cost within a short time and the probe having a small spring for electric connection can be provided.

All examples and conditional language recited herein are intended for pedagogical purposes to aid the reader in understanding the embodiments and the concepts contributed by the inventor to furthering the art, and are to be construed as being without limitation to such specifically recited examples and conditions, nor does the organization of such examples in the specification relate to a showing of superiority or inferiority of the embodiments. Although the probe has been described in detail, it should be understood that the various changes, substitutions, and alterations could be made hereto without departing from the spirit and scope of the invention.

What is claimed is:

1. A method of manufacturing a probe to be connected to an electrode terminal of an electric circuit or an electric component, the method comprising:
    forming a metallic plate having a predetermined shape;
    folding the metallic plate, and
    bending the first spring portion, the second spring portion, and the chassis portion, the first spring portion and the second spring portion being bent so that the first spring portion exists inside the second spring portion, and the second spring portion and the chassis portion being bent so that the second spring portion exists inside the chassis portion,
    wherein the metallic plate has a first contact terminal portion, a second spring portion, a first connecting portion, a first spring portion, a second connecting portion, a chassis portion, and a second contact terminal portion in this order from one end to another end,
    wherein, the first connecting portion and the second connecting portion are folded.

2. The method of manufacturing the probe according to claim 1,
    wherein, the first connecting portion and the second connecting portion are folded by about 180°, respectively.

3. A probe electrically connecting an electrode provided in an object to another electrode provided in another object, the probe comprising: a first spring; a second spring covering the first spring along an outer portion of the first spring, one end of the first spring continuing from one end of the second spring; a cover covering the second spring, the cover continuing from another end of the first spring, said cover entirely covering the first spring through the second spring; a first contact terminal contacting the electrode and continuing from another end of the second spring; and a second contact terminal contacting the another electrode and continuing from the cover.

4. The probe according to claim 3, wherein the second spring is configured to substantially cover the first spring.

5. The probe according to claim 3, wherein the cover portion is configured to substantially cover the second spring that substantially covers the first spring.

6. A probe formed of a single metal plate, for electrically connecting a first electrode terminal and a second electrode terminal of an electric circuit or an electric component, the probe comprising: a first spring; a second spring covering the first spring along an outer portion of the first spring; a cover configured to cover the second spring, said cover entirely covering the first spring through the second spring; a first terminal provided at one end of the probe and configured to contact with the first electrode terminal, said first terminal being configured to connect to the second spring; and a second terminal provided at another end of the probe and configured to contact with the second electrode terminal, said second terminal being configured to connect to the cover.

7. The probe according to claim 6, wherein the probe further includes:
   a plunger provided between the second spring and the first terminal,
   wherein the plunger contacts the cover.

* * * * *